(12) United States Patent  
Petrie

(10) Patent No.: US 8,736,369 B2  
(45) Date of Patent: May 27, 2014

(54) ELECTRONIC CIRCUIT FOR ADJUSTING AN OFFSET OF A DIFFERENTIAL AMPLIFIER

(75) Inventor: Craig S. Petrie, Merrimack, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 51 days.

(21) Appl. No.: 13/533,404

(22) Filed: Jun. 26, 2012

(65) Prior Publication Data

US 2013/0342273 A1 Dec. 26, 2013

(51) Int. Cl.
*H03F 3/45* (2006.01)
(52) U.S. Cl.
CPC .................................. *H03F 3/45* (2013.01)
USPC ................. 330/253; 330/9; 330/51
(58) Field of Classification Search
CPC ....................................................... H03F 3/45
USPC .................... 330/51, 253, 254, 9; 327/307
See application file for complete search history.

(56) References Cited

U.S. PATENT DOCUMENTS

| 6,967,526 B1 | 11/2005 | Churchill |
| 2006/0284671 A1 | 12/2006 | Ohba |
| 2007/0194847 A1 | 8/2007 | Machida |

FOREIGN PATENT DOCUMENTS

JP    H09-246885    9/1997

OTHER PUBLICATIONS

PCT Search Report and Written Opinion of the ISA dated Dec. 16, 2013; for PCT Pat. App. No. PCT/US2013/044260; 13 pages.

*Primary Examiner* — Robert Pascal
*Assistant Examiner* — Khiem Nguyen
(74) *Attorney, Agent, or Firm* — Daly, Crowley, Mofford & Durkee, LLP

(57) ABSTRACT

An electronic circuit has a differential amplifier with a differential transistor pair having two transistors. The electronic circuit also has two digital-to-analog converters, a respective one of the two digital-to-analog converters coupled to each respective one of the two transistors. Control bits adjust the DACs to provide an offset voltage adjustment of the differential amplifier.

26 Claims, 8 Drawing Sheets

ELECTRONIC CIRCUIT FOR ADJUSTING AN OFFSET OF A DIFFERENTIAL AMPLIFIER

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to an electronic circuit for which an offset voltage can be adjusted.

BACKGROUND OF THE INVENTION

As is known, differential amplifiers tend to have an undesirable offset voltage that results in a non-zero output voltage from the differential amplifier when the differential amplifier receives a differential input signal having a value of zero.

In addition, it is known that some types of sensing elements, including, but not limited to, magnetic field sensing elements, also tend to have undesirable offset voltages that result in a non-zero output voltage from the sensing element when the sensing element experiences a sensed parameter having a value of zero, e.g., a magnetic field with a value of zero.

When a sensing element is coupled to input nodes of a differential amplifier, the resulting offset voltage of the combination can be larger than the offset voltage of the differential amplifier or of the sensing element alone.

Some techniques have been used to reduce the offset voltage of a differential amplifier and/or of a combination of a sensing element with a differential amplifier.

Referring to FIG. 1, an offset reduction circuit 10 includes four magnetoresistance elements 12, each having a resistance proportional to a magnetic field, which are arranged in a Wheatstone bride 12. The bridge 12 generates a differential voltage signal 12a, 12b coupled to differential inputs of a differential amplifier 16, and, in particular, to a differential transistor arrangement 18, 20 within the differential amplifier 16.

Symbolically, in order to represent an offset voltage adjustment by way of input adjustment, a voltage source 14 is shown to be inserted into one of the couplings of the differential voltage signal 12a, 12b as shown. The voltage source 14 can be adjusted to cause an offset voltage of the combination of the differential amplifier 16 with the magnetoresistance element bridge 12 to be at or near zero. In other words, a voltage value of the voltage source 14 can be adjusted to cause an output signal 16a generated by the differential amplifier 16 to be zero when the magnetoresistance element bridge 12 experiences a magnetic field having a value of zero.

Also shown, in place of the magnetoresistance element bridge 12, a Hall Effect element 24 coupled between a current generator 22 and a voltage reference (e.g., ground), can generate a differential signal 24a, 24b that can be coupled to the input nodes of the differential amplifier. Similarly, a voltage value of the voltage source 14 can be adjusted to cause the output signal 16a generated by the differential amplifier 16 to be zero when the Hall Element 24 experience a magnetic field having a value of zero.

Though two types of magnetic field sensing elements are shown, the voltage source adjustment of the offset voltage is applicable to any type of sensing element, magnetic or not. Furthermore, the voltage source adjustment of the offset voltage is applicable to circuits that do not use a sensing element at all.

With further regard to the magnetoresistance element bridge 12, the magnetoresistance elements can be positioned in a magnetic field so that a pair of diagonally opposed magnetoresistance elements senses a field +B while the other pair of magnetoresistance elements senses an inverse field −B. This produces corresponding changes in a typical giant magnetoresistance (GMR) element resistance ($+/-\Delta R_B$) and generates a differential signal, $V_{BRIDGE}$, 12a, 12b at the bridge output terminals. The bridge output voltage is subsequently processed by a differential amplifier, often using a bipolar junction transistor (BJT) differential pair 18, 20 as shown.

GMR device mismatch due to fabrication variations produces GMR resistance variation ($\Delta R_{MMn}$) that remains when no magnetic field is applied. This leads to significant bridge output offset, which is defined herein as the bridge output voltage with a zero value input magnetic field. Offset voltage of the GMR elements tends to degrade accuracy performance a magnetic field sensor that uses GMR magnetoresistance elements.

Offset in GMR bridges is problematically large. When experiencing substantial magnetic fields, the resistance of a GMR device changes only about 5% before saturation; and a usable linear range is even smaller in many applications. Nominal resistance values of typical GMR elements match to 0.1 to 1% accuracy, depending on device size and fabrication technology. Thus, bridge offset can be large compared to usable signal range, up to (1%/5%)=20% of the signal range for these values. For very small magnetic fields generated, for example, in a highly accurate GMR current sensor, offset voltage can be larger than a detected signal.

Trimming, e.g., with the voltage source 14, is a conventional method used to remove or reduce bridge offset voltage. A digital-to-analog converter (DAC) (not shown) can be used to adjust the voltage source 14. In production testing, to accomplish the trimming, a zero magnetic field can be applied to the magnetic field sensor that has the magnetoresistance element bridge 12 and DAC input codes can be searched to find a code that generates the sensor output voltage 16a closest to zero.

Referring now to FIG. 2, an electronic circuit 70 shows a particular differential offset adjustment arrangement. The electronic circuit 70 includes a differential operational amplifier 72. Resistors R1, R2, R3, R4 are coupled around the operational amplifier 72 to provide a differential amplifying circuit 80, which is coupled to receive a differential input signal in+, in−, and which is configured to generate a differential output signal out+, out−. Offset adjustment can be implemented by injecting adjustment currents into input nodes 74, 76 of the differential amplifier 72.

It will be understood that input nodes 74, 76 of the differential amplifier 72 within the differential amplifying circuit 80 are so-called "virtual ground" nodes, i.e., nodes that have very low input impedances by virtue of feedback. The nodes 74, 76 are known to act as so-called "summing nodes." Equal currents injected into the nodes 74, 76 (with equal impedances) will have no effect upon output offset voltage. However, unequal currents injected into the nodes 74, 76 can be used to adjust output offset voltage.

Two cross-coupled R-2R digital-to-analog converters 78 (DACs) can be coupled to the input nodes 74, 76, and can provide an offset adjustment to the differential amplifying circuit 80 by injecting unequal currents into these nodes. The DACs 78 are shown here to be a switched resistor type of DACs.

The two DACs 78 can be coupled to receive two respective reference currents, I. Via cross-coupled switches, an expanded view of which is shown as element 82, currents can be injected from the two DACs 78 into the nodes 74, 76. The relative current received by each one of the input nodes 74, 76 is controlled by switching positions of the cross-coupled switches, which are, in turn, controlled by control bits $b_0$ to $b_{N-1}$.

It is known that R-2R DACs coupled as shown to the nodes 74, 76 can generate a binary-weighted offset adjustment, but without a typical DAC drawback of incurring exponential growth in area for each added bit of resolution.

The offset adjustment circuit of FIG. 2 requires the sensor signal, in+, in−, to pass through the same summing junctions 74, 76 as the offset adjustment signal generated by the DACs 78. These summing junctions 74, 76 perform the addition function described above in conjunction with FIG. 1, shown as a $V_{TRIM}$ voltage source 14 in FIG. 1. However, it may be undesirable to process the differential sensor signal, in+, in−, in this way. For example, the differential sensor signal, in+, in−, must drive input resistors $R_1$, Depending on the desired offset adjustment range, resistors $R_1$ may be small, presenting a low input resistance to the differential sensor signal, in+, in−. In particular, the resistor bridge of FIG. 1 is generally unable to drive a small input resistance, thus an additional buffer or amplifier stage may be required between the resistor bridge and the electronic circuit 70. An additional amplifier or buffer stage would negatively impact critical system parameters such as noise, offset, and bandwidth.

It would be desirable to provide a circuit for adjusting an offset voltage of a differential amplifier, or of a combination of a differential amplifier coupled to a magnetic field sensing element, for example, a GMR element or GMR bridge, but without adding extra amplifier stages in the magnetic field sensing element signal path.

SUMMARY OF THE INVENTION

The present invention provides a circuit for adjusting an offset voltage of a differential amplifier, or of a combination of a differential amplifier coupled to a magnetic field sensing element, for example, a GMR element or GMR bridge, but without adding extra amplifier stages in the magnetic field sensing element signal path.

In accordance with one aspect of the present invention, an electronic circuit includes a circuit substrate and a differential amplifier disposed upon the circuit substrate. The differential amplifier includes first and second transistors coupled together in a differential arrangement, each transistor having a respective control node comprising a base node or a gate node, each transistor having at least one respective current node comprising an emitter node of a source node through which a respective current flows. The electronic circuit also includes an offset correction circuit disposed upon the circuit substrate. The offset correction circuit is operable to adjust an offset voltage of the differential amplifier. The offset correction circuit includes a resistor network having a plurality of resistors, the resistor network coupled between the current nodes of the first and second transistors. The offset correction circuit also includes a plurality of current generators, each having first and second respective nodes. The offset correction circuit also includes a switching network having a plurality of switches, each switch having a respective control node and respective first and second switched nodes. The first switched nodes are coupled to the resistor network and the second switched nodes coupled to the first nodes of the plurality of current generators. The offset correction circuit also includes a selection circuit configured to generate a plurality of control signals, each control signal coupled to a respective control node of the switching network and operable to close at least a respective one of the plurality of switches.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "sensing element" is used to describe any electronic component that can sense any respective characteristic of the environment.

While certain circuits are shown below that are coupled to or otherwise include Hall Effect elements or magnetoresistance elements, it should be understood that the same circuits and techniques can apply to any other type of magnetic field sensing elements, to any type of sensing elements in general, or to differential amplifiers coupled to other circuits that do not include sensing elements.

As used herein, the phrase "current generator" is used to describe either a current source operable to generate a regulated current or a current sink operable to sink a regulated current.

Figure 3:
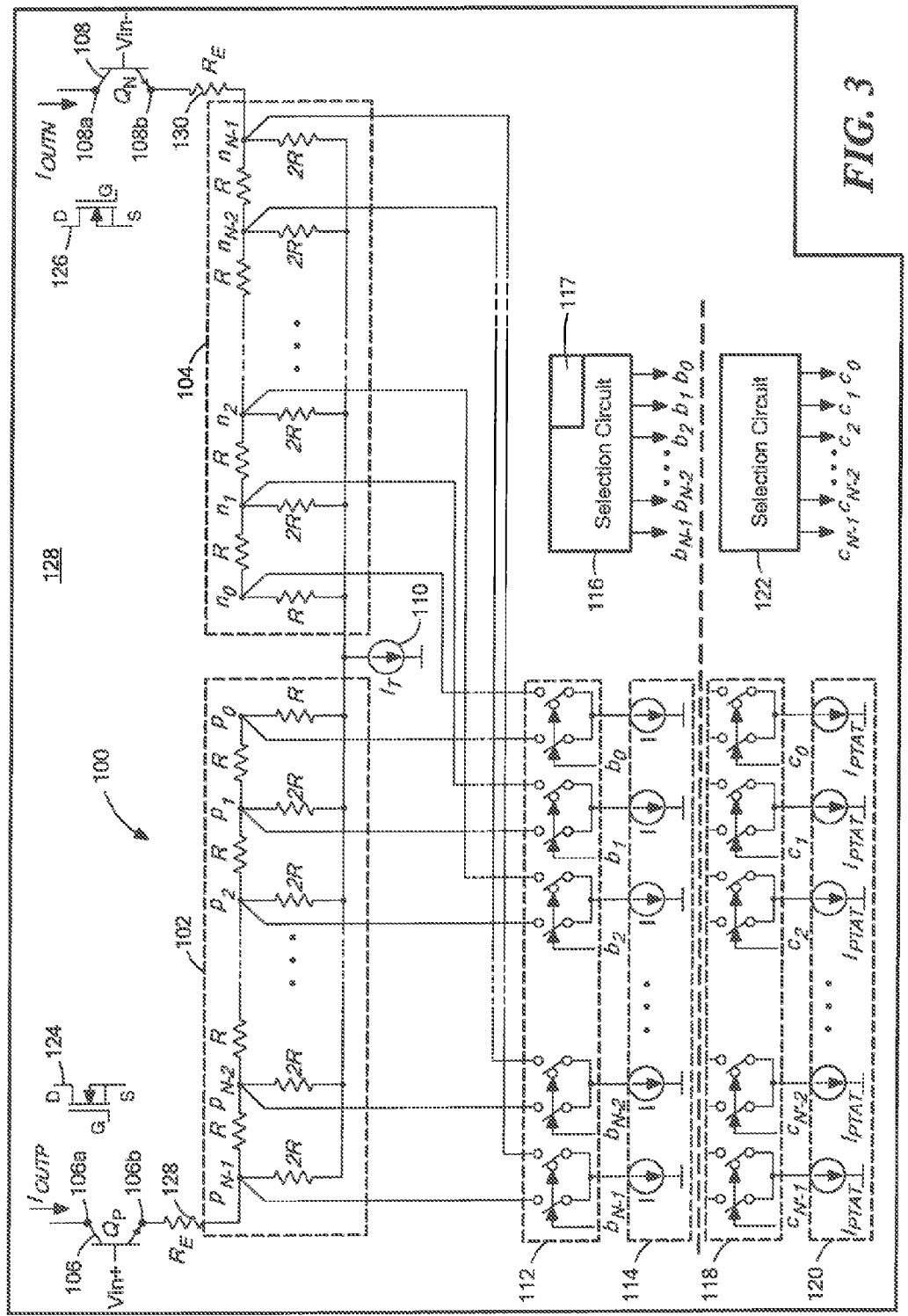
FIG. 3 is a block diagram showing an exemplary electronic circuit having a differential pair of NPN transistors (or alternatively, N-channel FETs), as may be used in a differential amplifier, and having two DACs, a first DAC coupled to an emitter of a first one of the differential pair of transistors and a second DAC coupled to an emitter of a second one of the pair of differential transistors, the two DACs providing an offset adjustment, each DAC coupled to a plurality of current generators through a plurality of switches.

Referring now to FIG. 3, an exemplary electronic circuit 100 includes two matched N-bit R-2R digital-to-analog converters (DACs) 102, 104. Each DAC 102, 104 is coupled in series with a respective emitter node of a respective NPN bipolar junction transistor (BJT) 106, 108. The two transistors 106, 108 are arranged as a differential pair of a differential amplifier, which can be the same as or similar to the differential pair 18, 20 of the differential amplifier 16 of FIG. 1. Although BJT devices 106, 108 are shown, N-channel MOSFET devices 124, 126 could instead be used.

As used herein, when referring to the bipolar junction transistors (BJTs) 106, 108, the phrase "current node" is used to refer to the emitter of the transistors. The phrase "current node" can also be used to describe the source of the field effect transistors (FETs). It will be understood that most of the current flowing though the BJTs flows either into or out of the emitter, and most of the current flowing through the FETs flows either into or out of the source.

Accordingly, the transistor 106 can include first and second current nodes 106a, 106b, respectively, between which a current, $I_{OUTP}$, flows. The transistor 108 can include first and second current nodes 108a, 108b, respectively, between which a current, $I_{OUTN}$, flows.

The electronic circuit 100 also includes an offset correction circuit. The offset correction circuit can include a resistor network, e.g., the two DACs 102, 104. The resistor network has a plurality of resistors. The resistor network 102, 104 is coupled between current nodes, i.e., between emitters, 106b, 108b of the first and second transistors 106, 108, respectively. The offset correction circuit also includes a plurality of current generators 114 having first and second respective nodes. In some embodiments, the second nodes can be coupled to a reference voltage node, here a ground. The offset correction circuit also includes a switching network 112 having a plurality of switches, each switch having a respective control node and respective first and second switched nodes. The first switched nodes are coupled to the resistor network 102, 104 and the second switched nodes are coupled to the first nodes of the plurality of current generators 114. The offset correction circuit also includes a selection circuit 116 configured to generate a plurality of control signals $b_0$ to $b_{N-1}$, each control signal coupled to a respective control node of the switching network 112 and operable to close at least a respective one of the plurality of switches of the switching network.

The two digital-to-analog converters (DACs) 102, 104 are shown here to be switched current types of DACs, each having an R-2R structure.

All elements of the electronic circuit 100 can be disposed upon a common substrate 128, for example, a silicon substrate, within an integrated circuit.

In operation, by way of the switching network 112, each one of the DAC control bits, $b_0$-$b_{N-1}$, selects whether a respective matched reference current, I, generated by a respective one of a plurality of current generators 120 is routed by the switches 112 to a positive (left) side or to a negative (right) of the differential pair 106, 108. For example, if $b_{N-1}$, the most significant bit (MSB) of the input control word, is high, the left-most current generator is routed to a node $p_{N-1}$; otherwise it is routed to a node $n_{N-1}$. Likewise, $b_0$, the least significant bit (LSB), selects whether current is routed to node $p_0$ or $n_0$. If a larger-than-midrange DAC input control word is selected, more current is sunk from the positive (left) than the negative (right). This creates a net positive voltage drop across both R-2R structures from right to left, resulting in $V(n_{N-1}) > V(p_{N-1})$ (voltages at nodes $n_{N-1}$ and $p_{N-1}$). This condition will correct for a negative input bridge offset, when $V(in+) < V(in-)$, and can force equal output currents ($I_{OUTP} = I_{OUTN}$), i.e., cancel the offset voltage, if $V(in+) - V(in-) = V(p_{N-1}) - V(n_{N-1})$. The R-2R structures 102, 104 adjust the voltage $V(p_{N-1}) - V(n_{N-1})$ in a binary weighted fashion as each one of the input control bits, $b_0$-$b_{N-1}$, changes. Analysis provided below shows that the circuit 100 can be used as an offset adjustment DAC with range and step size as follows:

$$\text{range} = \pm 2IR(1 - 2^{-N}) \qquad (1)$$

$$\text{step size} = 1R \cdot 2^{2-N} \qquad (2)$$

As described above, in addition to performing offset voltage adjustment, the electronic circuit 100 also serves as a differential input amplifier stage using input transistors 106, $Q_P$, and 108, $Q_N$. The R-2R DACs 102, 104 form an emitter degeneration resistor with equivalent resistance R.

Optionally, two resistors, $R_E$, 128, 130 can be coupled between emitters of the transistors 106, 108, respectively and the DACs 102, 104, respectively. The resistors, $R_E$, 128, 130 can increase degeneration resistance beyond the resistance, R, which is expected to be small. The resistors, $R_E$, 128, 130 do not affect operation of the DACs 102, 104.

Optionally, a bias current, $I_T$, generated by a current generator 110 can be coupled to an input node of both DACs 102, 104 in order to permit more control in selecting a suitable bias current for the transistors 106, 108. The current, $I_T$, 110 splits evenly between the two transistors 106, 108. The current, $I_T$, 110 does not affect DAC operation.

When voltage offset is cancelled, the emitter current of both transistors 106, 108 is equal to $0.5(I_T + N \cdot I)$, where N is a number of control bits, $b_0$-$b_{N-1}$. It is expected that the current, I, is small relative to the current, $I_T$, to meet design requirements for a typical input amplifier. In one particular embodiment, I=40 µA, $I_T$=480 µA, there are N=eight DAC R-2R segments, and a corresponding eight current sources, I.

The control bits, $b_0$-$b_{N-1}$, that control the DACs 102, 104 can be generated by a selection circuit 116. In some embodiments, the selection circuit 116 includes a memory device 117 configured to store a code (or alternatively, one or more selectable codes) indicative of states, i.e., high and low states, of the control bits $b_0$-$b_{N-1}$. In some embodiments, the memory device 117 is an electrically erasable programmable read-only memory EEPROM). In some other embodiments, the memory device 117 is a device having one-time fusible links, i.e., a one-time programmable (OTP) device. The memory device 117 within the selection circuit 116 can be The set of switches 118 can be controlled by control bits $c_0$-$c_{N-1}$. The various control bits, $c_0$-$c_{N-1}$, can be generated by another selection circuit 122. The selection circuit 122 can be the same as or similar to the selection circuit 116.

Optionally, another set of switches 118 and another set of current generators 120 can be used to provide a temperature compensation of the electronic circuit 100. The switches 118 can be coupled such that outputs of the switches are coupled to outputs of the switches 112. This will sum the two current contributions at nodes $n_0$-$n_{N-1}$ and $p_0$-$p_{N-1}$. The current generators 120 can have a current value, $I_{PTAT}$. The current value, $I_{PTAT}$, can be a current value that is proportional to temperature. Generation of the current value, $I_{PTAT}$, is described more fully below in conjunction with FIG. 4. Let it suffice here to say that the switches 118 coupled to the current generators 120 can provide the compensation of the offset voltage of the differential pair of transistors 106, 108 or 124, 126 that is stable with respect to temperature changes.

The set of switches 118 can be controlled by control bits $c_0$-$c_{N-1}$. The various control bits, $c_0$-$c_{N-1}$, can be generated by another selection circuit 122. The selection circuit 122 can be the same as or similar to the selection circuit 118.

Figure 1:
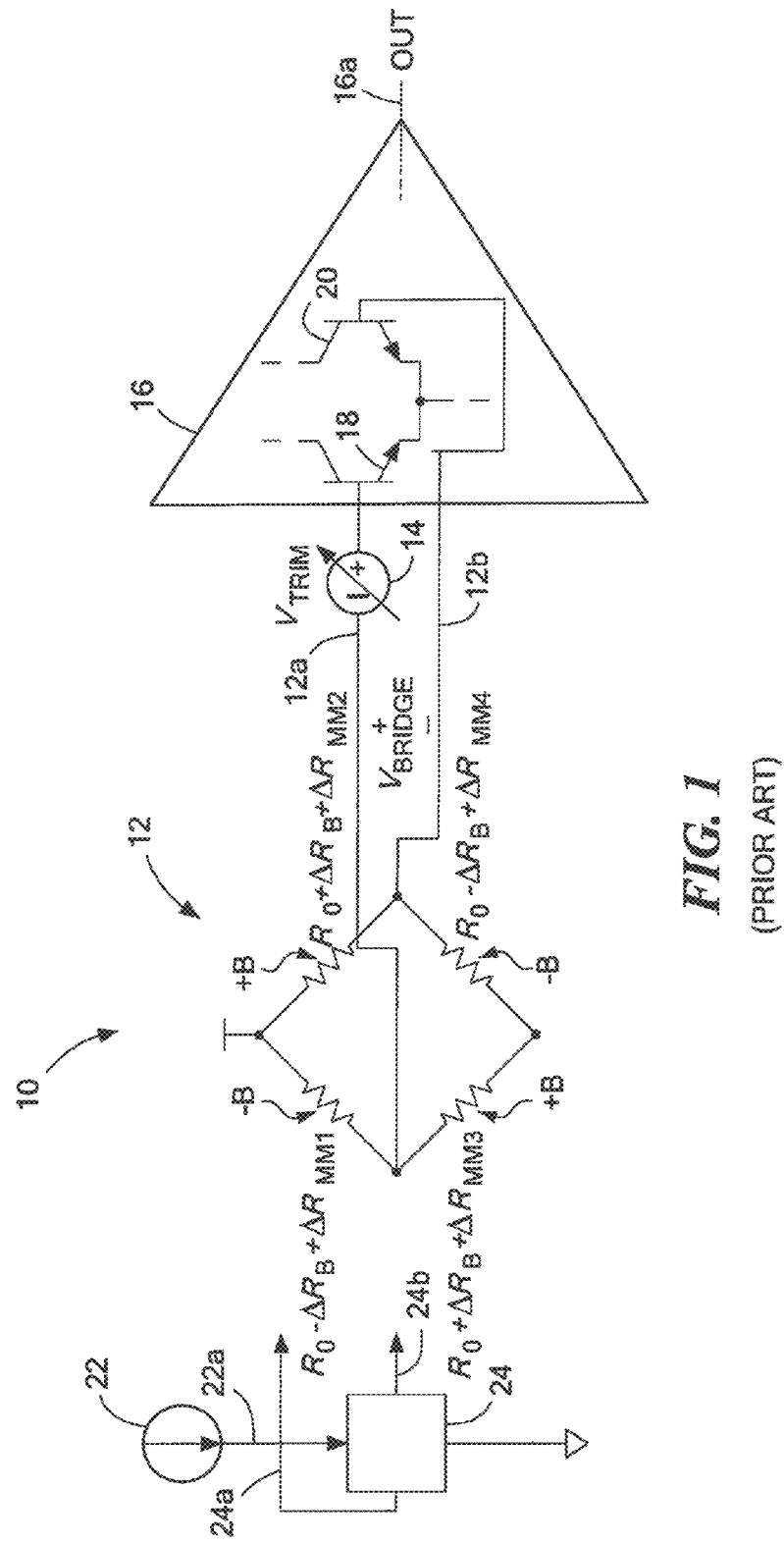
FIG. 1 is a block diagram showing an electronic circuit having a differential amplifier coupled to four magnetoresistance elements arranged in a Wheatstone bridge, and showing a voltage source to represent an offset trim.
Figure 2:
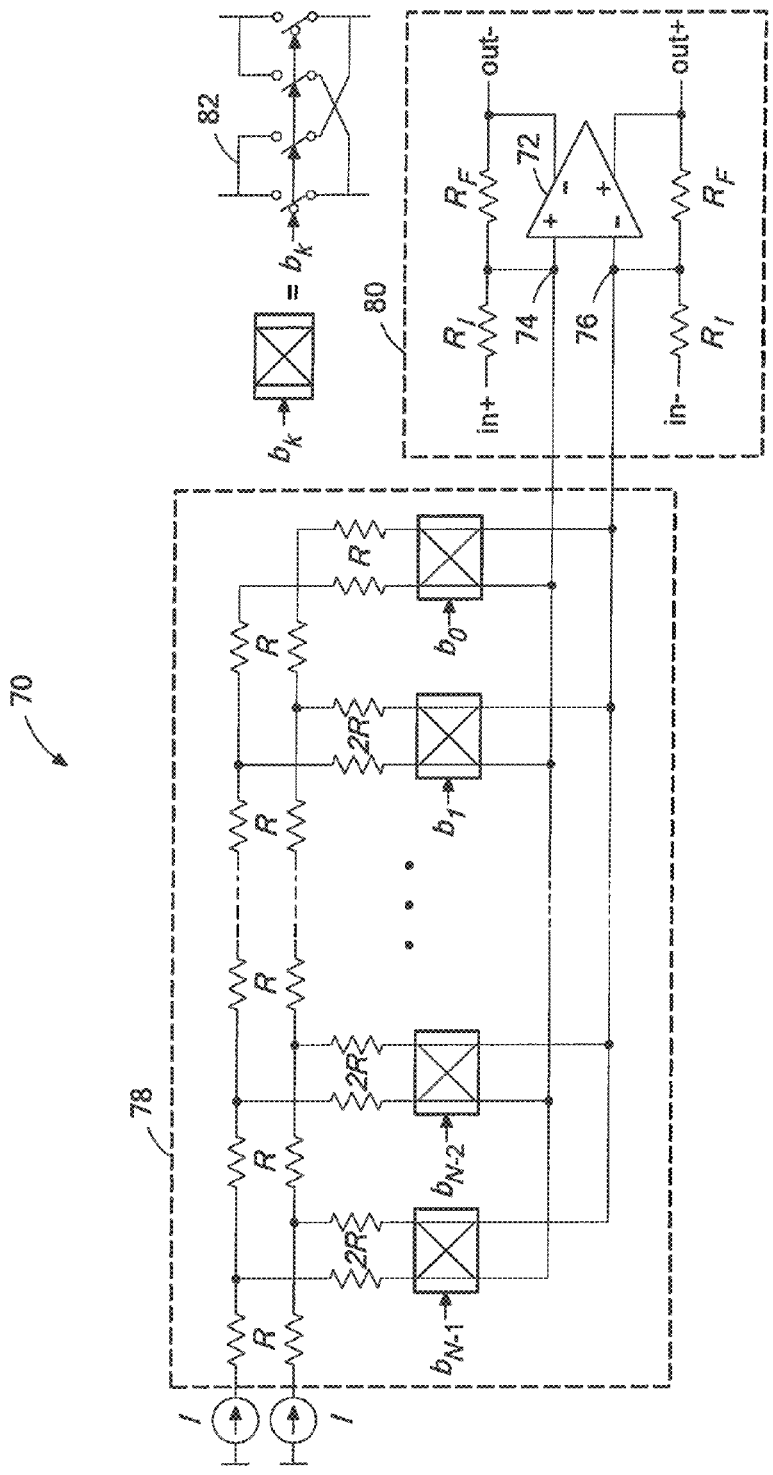
FIG. 2 is a block diagram showing a conventional electronic circuit having an operational amplifier with two cross-coupled digital-to-analog converters (DACs) coupled to a respective two summing nodes to provide an offset trim.

It should be apparent that, unlike the electronic circuit 70 of FIG. 2, the electronic circuit 100 presents a relatively high input resistance to one or more sensing elements, e.g., the magnetoresistance element bridge 12 of FIG. 1, which provides an input signal to the electronic circuit 100. Thus, in many embodiments, there is no need for an additional amplifier or buffer stage between the one or more sensing elements and the electronic circuit 100.

Figure 3A:
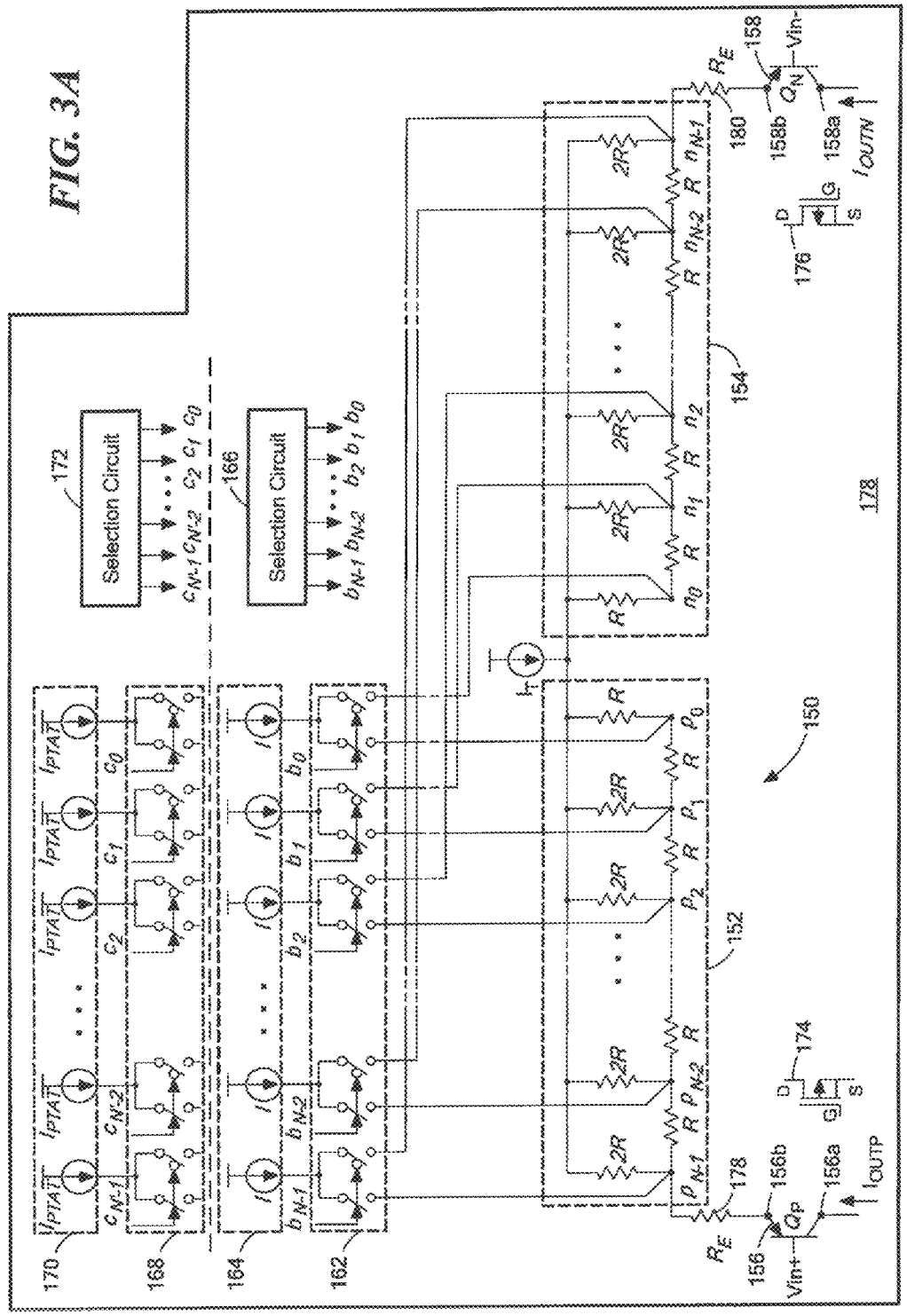
FIG. 3A is a block diagram showing another exemplary electronic circuit having a differential pair of PNP transistors (or alternatively, P-channel FETs), as may be used in a differential amplifier, and having two DACs, a first DAC coupled to an emitter of a first one of the differential pair of transistors and a second DAC coupled to an emitter of a second one of the pair of differential transistors, the two DACs providing an offset adjustment, each DAC coupled to a plurality of current generators through a plurality of switches.

Referring now to FIG. 3A, another exemplary electronic circuit 150 is like the electronic circuit 100 of FIG. 3, but coupled differently when used with PNP bipolar junction transistors (BJTs) 156, 158 or with P-channel MOSFET devices 174, 176. The exemplary electronic circuit 150 includes two matched N-bit R-2R digital-to-analog converters (DACs) 152, 154, each one coupled in series with a respective one of the emitter nodes (i.e., current nodes) 156b, 158b of two respective PNP bipolar junction transistors (BJTs) 156, 158. The two PNP transistors 156, 158 are arranged as a differential pair. Although BJT devices 156, 158 are shown, P-channel MOSFET devices 174, 176 could instead be used.

The DACs 152, 154 have the same structure as the DACs 102, 104 of FIG. 3. The DACs 152, 154 are shown here to be switched current type of DACs, each having an R-2R structure. Each one of the DAC control bits, $b_0$-$b_{N-1}$, selects whether a respective matched reference current generated by a respective one of a plurality of current generators 164 is routed by switches 162 to a positive (left) side or to a negative (right) of the differential pair 156, 158. Equations (1) and (2) apply to the range and to the step size of the electronic circuit 150.

Optionally, two resistors, $R_E$, 178, 180 can be coupled between emitters of the transistors 156, 158, respectively and the DACs 152, 154, respectively. The resistors, $R_E$, 178, 180 can increase degeneration resistance beyond the resistance, R, which is expected to be small. The resistors, $R_E$, 178, 180 do not affect operation of the DACs 152, 154.

Optionally, a bias current, $I_T$, generated by a current generator 160 can be coupled to an input of both DACs 152, 154 in order to permit more control in selecting a suitable bias current for the transistors 156, 158. The current, $I_T$, splits evenly between both transistors 156, 158. The current, $I_T$, does not affect DAC operation.

All elements of the electronic circuit 150 can be disposed upon a common substrate 178, for example, a silicon substrate, within an integrated circuit.

When voltage offset is cancelled, the emitter current of both transistors 156, 158 is equal to $0.5(I_T+N \cdot I)$, where N is the number of control bits, $b_0$-$b_{N-1}$. It is expected that the current, I, is small relative to the current $I_T$, 160 to meet design requirements for a typical input amplifier. In one particular embodiment, $I=40$ μA, $I_T=480$ μA, there are N=eight DAC R-2R segments, and a corresponding eight current sources, I.

The control bits, $b_0$-$b_{N-1}$, that control the DACs 152, 154 can be generated by a selection circuit 168, which can be the same as or similar to the selection circuit 116 of FIG. 3.

Optionally, another set of switches 168 and another set of current generators 170 can be used to provide a temperature compensation of the electronic circuit 150. The switches 163 can he coupled such that outputs of the switches are coupled in parallel with outputs of the switches 162. The current generators 170 can have the above-described current value, $I_{PTAT}$. The set of switches 168 can be controlled by control bits, $c_0$-$c_{N-1}$. The control bits, $c_0$-$c_{N-1}$, can be generated by another selection circuit 172. The selection circuit 172 can be the same as or similar to the selection circuit 168, and also similar to the selection circuits 116, 122 of FIG. 3.

Operation of the switches 168 and the current generators 170 will be understood from the discussion above in conjunction with FIG. 3.

Figure 4:
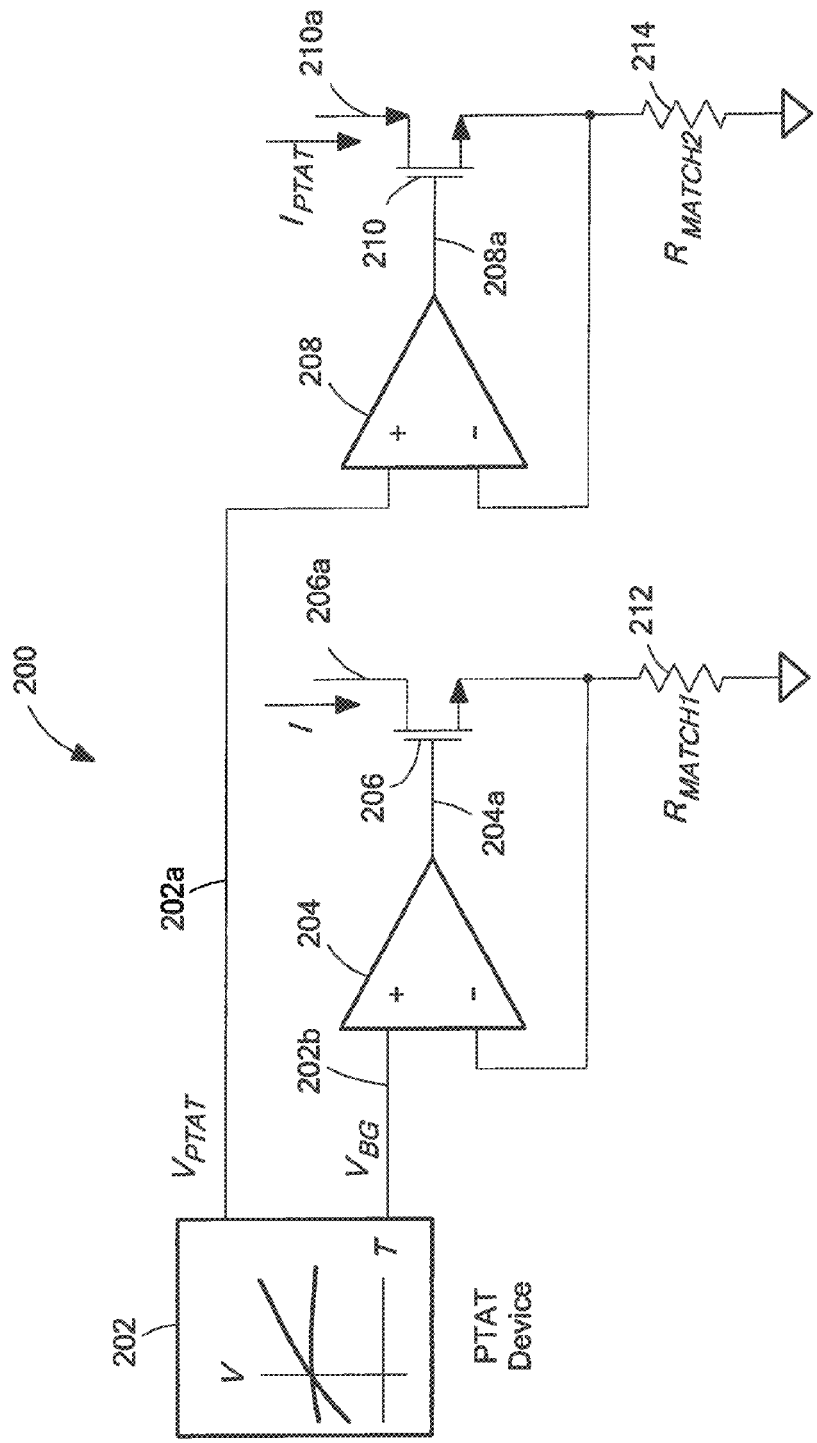
FIG. 4 is a block diagram showing an electronic circuit that can be used to provide the current generators of FIGS. 3 and 3A.

Referring now to FIG. 4, an electronic circuit 200 can include a proportional to absolute temperature (PTAT) device 202 configured to generate a band gap voltage 202b and a PTAT voltage 202a. It will be understood that the band gap voltage 202b is substantially invariant with respect to temperature. It will also be understood that the PTAT voltage 202a has a value that is proportional to temperature in a known relationship.

The band gap voltage 202b can be coupled to an operational amplifier 204, which can provide a control voltage 204a to control a field effect transistor 206 in a current generator configuration. A resistor 212 can be coupled to a source of the field effect transistor 206. The resistor 212 can be coupled to another input of the operational amplifier 204. The resistor 212 can have a value, $R_{MATCH1}$. A regulated current 206a can flow into the drain of the FET 206. The regulated current 206a has a value that is substantially invariant with respect to temperature.

In a preferred embodiment, $R_{MATCH1}=k_1 R$, where R is that shown in FIGS. 3 and 3A, and where $k_1$ is a scaling constant. In a preferred embodiment, $k_1$ is fixed by forming $R_{MATCH1}$ from a combination of resistances R in series and/or in parallel. With this relationship, the resistances, particularly when fabricated on the same circuit die, will vary substantially in the same way with respect to temperature. Thus, the current, I, will have a temperature dependence according to the temperature dependence of the resistance, R, but such that the current, I, will create a temperature-independent voltage when passing through the resistance, R, in the electronic circuit 200 and in the electronic circuits 100, 150 of FIGS. 3 and 3A.

The PTAT voltage 202a can be coupled to an operational amplifier 208, which can provide a control voltage 208a to control a field effect transistor 210 in a current generator configuration. A resistor 214 can be coupled to a source of the field effect transistor 210. The resistor 214 can be coupled to another input of the operational amplifier 208. The resistor 214 can have a value, $R_{MATCH2}$. A regulated current 210a can flow into the drain of the FET 210. The regulated current 210a has a value that is proportional to temperature in a known relationship. For reasons described above, in a preferred embodiment, $R_{MATCH2}=k_2 R$, where R is that shown in FIGS. 3 and 3A, and where $k_2$ is a scaling constant similar to $k_1$ above.

In some embodiments, the operational amplifiers 204, 208, the FETs 206, 210, and the resistors 212, 214 can be replicated a plurality of times, each coupled to the PTAT device 202, to provide the plurality of current generators 114, 120 of FIG. 3, and also to provide the plurality of current generators 164, 170, respectively, of FIG. 3A. However, in preferred embodiments, the currents, I and $I_{PTAT}$ of FIG. 4, can instead be replicated with current mirrors.

It may be desirable to make DAC range and offset step size values stable over process and temperature. According to equations (1) and (2) above, for a given N-bit DAC, range and step size depend only on I and R. As is well known, a PTAT device, for example, the PTAT device 202, can be used to generate a current that produces a stable IR product. The electronic circuit 200 can generate currents 206a, 210a having values I and $I_{PTAT}$, respectively, which can be used to generate IR values that are both independent of temperature and also proportional to temperature, respectively.

When N replicas of these two currents, e.g., provided by current mirrors as described above, are used with two N-bit switching banks, e.g., the sets of switches 112, 118 of FIG. 3 or the sets of switches 162, 168 of FIG. 3A, adjustment of both offset and offset temperature drift can be realized. No additional R-2R resistor networks are needed.

The current biasing the amplifier input transistors 106, 108 or 178, 180 of FIG. 3 or 3A, respectively, is determined by $0.5(I_T + N \cdot I + N' \cdot I_{PTAT})$, where N is the number of control bits, $b_0$-$b_{N-1}$, and where N' is the number of control bits, $c_0$-$c_{N'-1}$. In some embodiments, N=N'. The current biasing may have an undesirable temperature dependence from currents $N \cdot I$ and $N' \cdot I_{PTAT}$. However, since this bias current, $0.5(I_T + N \cdot I + N' \cdot I_{PTAT})$, does not depend on DAC input code, the current, $I_T$, can be adjusted to cancel any undesirable temperature dependence from the DAC currents, $N \cdot I$ and $N' \cdot I_{PTAT}$, regardless of input code selection.

While a band gap voltage is described above, it will be understood that there are other ways to generate a voltage reference that is stable with respect to temperature. While a PTAT device is shown above, it will be understood that there are other ways to generate a temperature dependent voltage comparable to the voltage, $V_{PTAT}$. Furthermore, while a PTAT device is shown that can generate both of the voltages $V_{BG}$ and $V_{PTAT}$, it will be understood that similar voltages can be generated by separate devices.

Figure 5:
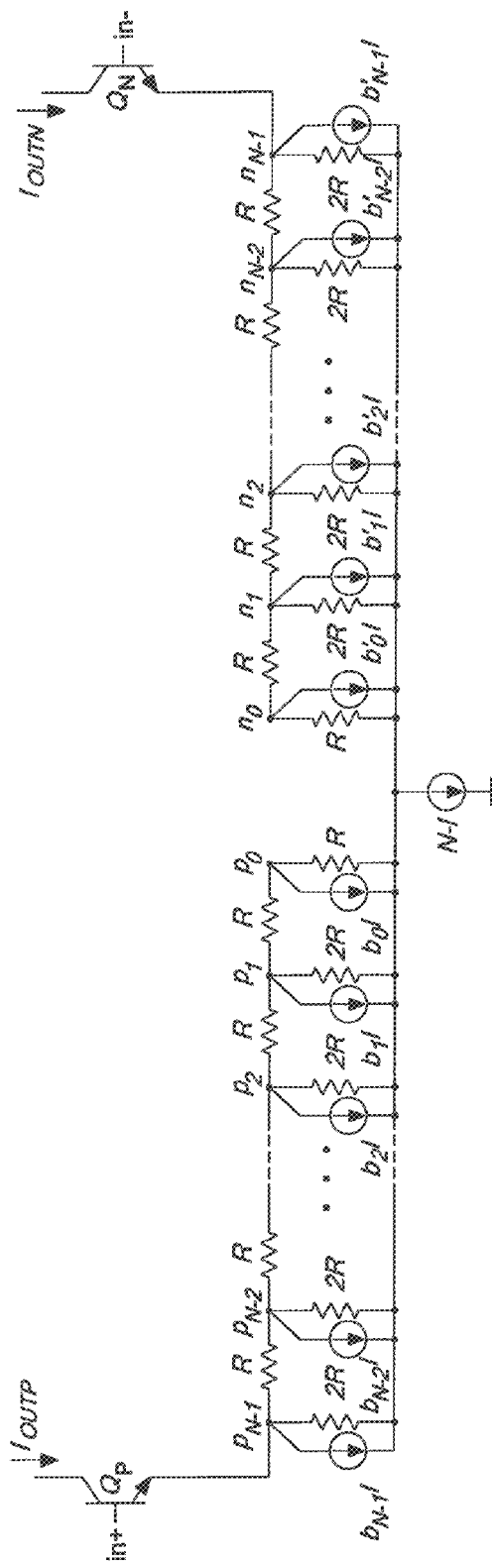
FIG. 5 is a block diagram of an equivalent circuit of parts of the electronic circuits of FIGS. 3 and 3A.

Referring now to FIG. 5, an equivalent circuit is used below to show that the electronic circuit 100 of FIG. 3 can generate the range and step size of equations (1) and (2). The simplified equivalent circuit can be representative of the electronic circuit 100 of FIG. 3, but shown for a simplified case where $I_T=0$ and $R_E=0$ and where the set of switches 118 and the set of current generators 120 are omitted. The set of switches 112 is also omitted and current generators are instead turned on or off by parameters $b_i$ or $b'_i$, which represent complementary DAC input control signals and assume values of either 0 or 1 (for each i, $b'_i=0$ if $b_i=1$, and $b'_i=1$ if $b_i=0$). Current generators sum into the common differential amplifier tail node (the node above the current generator, N·I). Since, in this equivalent circuit, the sum of all DAC currents is always N·I, i.e., $$\sum_{i=0}^{N-1} b_i I + b'_i I = N \cdot I,$$

the circuit is equivalent to FIG. 3 if an extra current N·I is pulled from this tail node by another equivalent current generator, identified as N·I.

Figure 6:
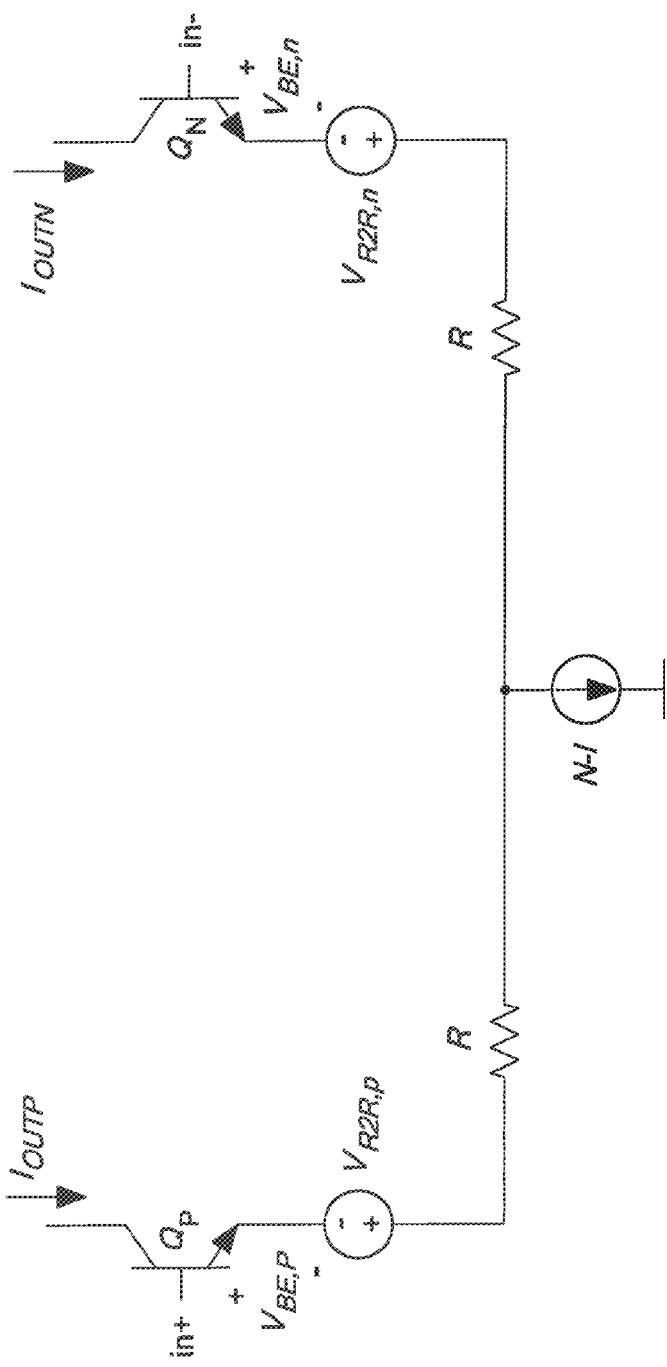
FIG. 6 is a block diagram of a simplified equivalent circuit of parts of the electronic circuits of FIGS. 3 and 3A.

Referring now to FIG. 6, a further simplified equivalent circuit can be obtained from FIG. 5 using repeated application of Thevenin's and Norton's theorems. Voltages, $V_{R2R,p}$ and $V_{R2R,n}$ of FIG. 6, have values that depend on $b_i$ DAC selection bits as follows:

$$V_{R2R,p} = IR\left(b_{N-1} + \frac{b_{N-2}}{2} + \ldots + \frac{b_1}{2^{N-2}} + \frac{b_0}{2^{N-1}}\right) = IR \sum_{i=1}^{N} \frac{b_i}{2^{N-i}} \quad (3)$$

$$V_{R2R,n} = IR\left(b'_{N-1} + \frac{b'_{N-2}}{2} + \ldots + \frac{b'_1}{2^{N-2}} + \frac{b'_0}{2^{N-1}}\right) = IR \sum_{i=1}^{N} \frac{b'_i}{2^{N-i}} \quad (4)$$

The further simplified equivalent circuit of FIG. 6 can be used to find $V_{TRIM}$, the corrective input offset voltage induced by the offset adjustment circuit. A value of the voltage, $V_{TRIM}$, is the inverse of the voltage (Vin+-Vin−) across the input terminals at the differential transistor arrangement necessary to force a zero output voltage, when $I_{OUTP}=I_{OUTN}$. Applying $(-V_{TRIM})$ to the input terminals and summing voltages around the Vin+/Vin− voltage loop, $$-V_{TRIM}=V_{BE,p}-V_{R2R,p}+\tfrac{1}{2}NIR-\tfrac{1}{2}NIR+V_{R2R,n}-V_{BE,n},$$
or (5)

$$V_{TRIM}=V_{R2R,p}-V_{R2R,n}, \quad (6)$$

where $V_{BE,p}=V_{BE,n}$ was utilized because $I_{OUTP}=I_{OUTN}$. Substituting equations (3) and (4) into equation (6) yields:

$$V_{TRIM} = IR \sum_{i=1}^{N} \frac{b_i - b'_i}{2^{N-i}}. \quad (7)$$

Therefore, the voltage, $V_{TRIM}$, is a binary-weighted sum of the control bits $b_i$. The DAC range is found from the above equation by subtracting the minimum value of the voltage, $V_{TRIM}$, when all $b_i=0$ and all $b'_i=1$, from the maximum $V_{TRIM}$, when all $b_i=1$ and all $b'_i=0$. This yields, as described above:

$$\text{range}=\pm 2IR \cdot (1-2^{-N}), \quad (8)$$

which is approximately +/−2IR for larger N-bit DACs. Step size is found from Eq. (7) by subtracting the value of $V_{TRIM}$ at adjacent input codes, for example, $(b_{N-1} \ldots b_0)=(00 \ldots 00)$ and $(00 \ldots 01)$. This yields, as described above:

$$\text{step size}=IR \cdot 2^{2-N}. \quad (9)$$

Figure 7:
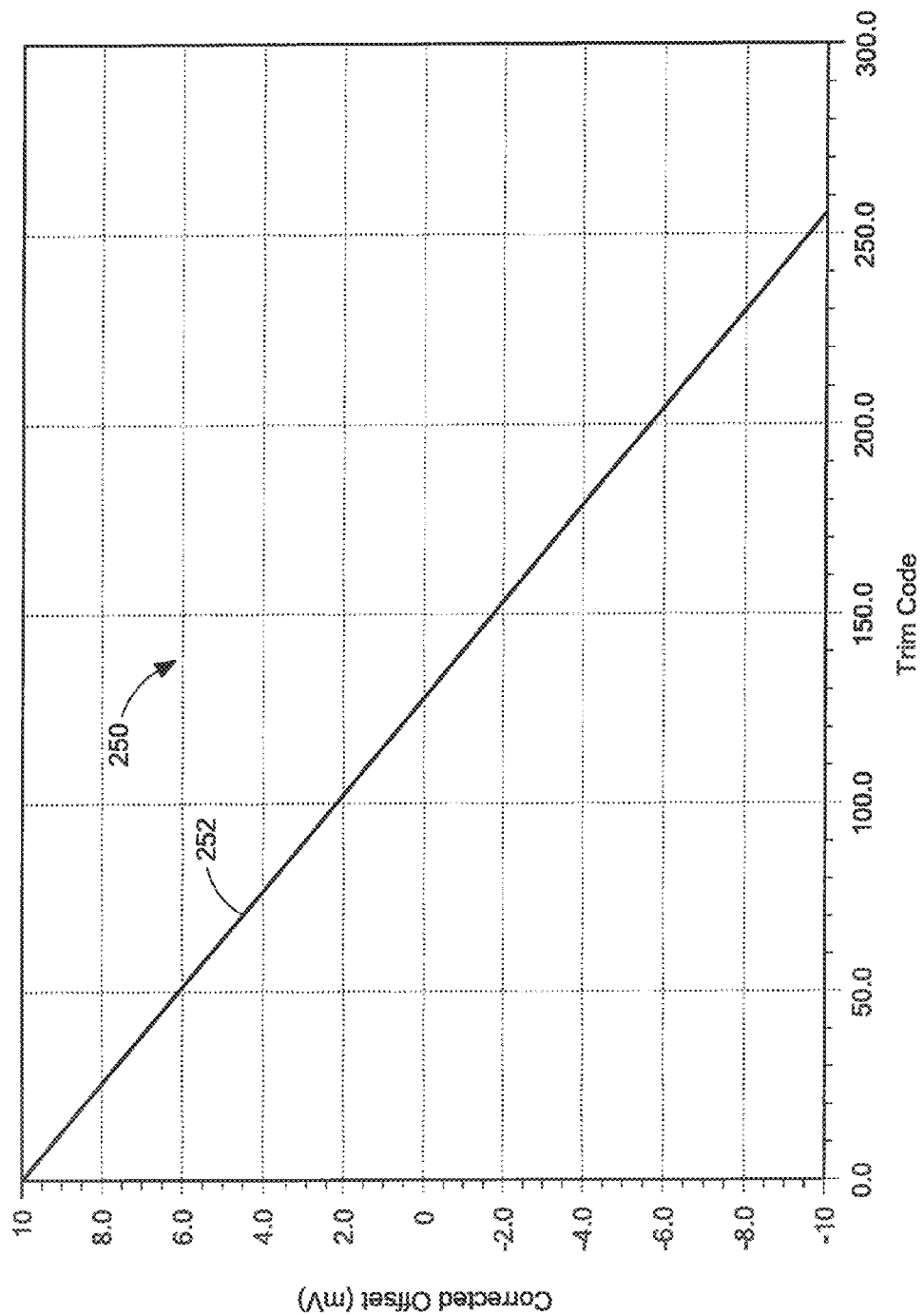
FIG. 7 is a graph showing simulation results of offset voltage control of the electronic circuit of FIG. 3.

Referring now to FIG. 7, a graph 250 has a horizontal axis with a scale in units of the binary value, the decimal code represented by $b_{N-1} \ldots b_0$, where $b_{N-1}$ to $b_0$ are the control bits in FIGS. 3 and 3A. In other words, $b_{N-1} \ldots b_0$ represents an adjustment value from 0 to 255, assuming eight bits of adjustment (N=8). The graph 250 also has a vertical axis with a scale in units of corrected offset voltage, i.e., offset correction in units of millivolts.

A curve 252 is representative of corrected offset voltage versus adjustment code for a simulated N=8-bit adjustment circuit using simulation of the circuit topology of FIG. 3. Chosen parameters are tabulated in Table 1 below. The curve 252 shows simulation results for the input offset value cancelled by the adjustment DACs 102, 104 as the input digital code is swept through all 256 possible codes. Simulation results for range, step size, and DAC linearity are consistent with analytical results.

TABLE 1

Example offset adjustment design parameters

| Parameter | Design Value |
|---|---|
| N, # of DAC Bits | 8 |
| I, R-2R DAC unit current | 40 µA |
| R, R-2R DAC unit resistance | 125 Ω |
| DAC range | +/−9.96 mV |
| DAC step size | 78.125 µV |

The curve 252 is linear.

While DACs having resistance ratios of two, i.e., R-2R DACs, are shown in electronic circuits above, it should be understood DACs having other resistance ratios can also be used, including DACs that have different resistance ratios at only some of the DAC stages. Such DACs would not provide a linear relationship between corrected offset and offset adjustment code as shown above in conjunction with FIG. 7. However, in some applications it may be desirable to have a nonlinear correction curve.

It should be apparent that the circuits and techniques described above can apply to any sensing elements, not only to magnetic field sensing elements. Particular advantages are described above for sensing elements that have a relatively high output resistance.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An electronic circuit, comprising:
   a circuit substrate;
   a differential amplifier disposed upon the circuit substrate, the differential amplifier comprising first and second transistors coupled together in a differential arrangement, each transistor having a respective control node comprising a base node or a gate node, and each transistor having a respective current node comprising an emitter node or a source node through which a respective current flows; and
   an offset correction circuit disposed upon the circuit substrate, the offset correction circuit operable to adjust an offset voltage of the differential amplifier, the offset correction circuit comprising:
      a resistor network having a plurality of resistors, the resistor network coupled between the current nodes of the first and second transistors;
      a plurality of current generators, each current generator having first and second respective nodes;
      a switching network having a plurality of switches, each switch having a respective control node and respective first and second switched nodes, the first switched nodes coupled to the resistor network and the second switched nodes coupled to the first nodes of the plurality of current generators; and
      a selection circuit configured to generate a plurality of control signals, each control signal coupled to a respective control node of the switching network and operable to close at least a respective one of the plurality of switches.

2. The electronic circuit of claim 1, wherein the plurality of resistors has values of R and 2R and is arranged as first and second R-2R networks, the first R-2R network forming a first digital-to-analog converter (DAC) and the second R-2R network forming a second digital-to-analog converter (DAC), the first DAC having a node coupled to the first transistor and the second DAC having a node coupled to the second transistor.

3. The electronic circuit of claim 2, wherein the plurality of switches is arranged as pairs of switches, each pair of switches having a first switch coupled to the first DAC and a second switch coupled to the second DAC, wherein the first switch closes and the second switch opens in response to particular state of a control signal received at control nodes of the first and second switches, directing a current generated by one of the plurality of current generators to either the first DAC of to the second DAC accordingly.

4. The electronic circuit of claim 1, wherein the selection circuit comprises a programmable device configured to store a value indicative of selected ones of the plurality of switches that are closed.

5. The electronic circuit of claim 4, wherein the programmable device comprises an EEPROM.

6. The electronic circuit of claim 4, wherein the programmable device comprises a plurality of fusible links.

7. The electronic circuit of claim 1, wherein the first and second transistors are NPN bipolar transistors.

8. The electronic circuit of claim 1, wherein the first and second transistors are PNP bipolar transistors.

9. The electronic circuit of claim 1, wherein the first and second transistors are N-channel field effect transistors (FETs).

10. The electronic circuit of claim 1, wherein the first and second transistors are P-channel field effect transistors (FETs).

11. The electronic circuit of claim 1, wherein the plurality of current generators comprises:
   a reference voltage generating device configured to generate a reference voltage that is stable with respect to temperature;
   a temperature proportional voltage generating device configured to generate a temperature proportional voltage that is proportional to temperature;
   a first respective current generator coupled to receive the reference voltage and configured to generate a reference current; and
   a second respective current generator coupled to receive the temperature proportional voltage and configured to generate a temperature proportional current that is proportional to temperature.

12. The electronic circuit of claim 11, wherein the plurality of switches comprises a first plurality of switches and a second plurality of switches coupled together in a plurality of pairs of switches, each pair of switches comprised of a respective one of the first plurality of switches coupled to a respective one of the second plurality of switches, and wherein the first plurality of switches is coupled to receive the reference current from a respective one of the plurality of current generators, and wherein the second plurality of switches is coupled to receive the temperature proportional current from a respective one of the plurality of current generators.

13. The electronic circuit of claim 12, wherein the selection circuit comprises a programmable device configured to store a value indicative of selected ones of the first plurality of switches and selected ones of the second plurality of switches that are closed.

14. The electronic circuit of claim 13, wherein the programmable device comprises an EEPROM.

15. The electronic circuit of claim 13, wherein the programmable device comprises a plurality of fusible links.

16. The electronic circuit of claim 1, further comprising:
one or more magnetic field sensing elements coupled to the control nodes of the first and second transistors, Wherein the one or more magnetic field sensing elements disposed upon the circuit substrate forming a magnetic field sensor.

17. The electronic circuit of claim 16, wherein the one or more magnetic field sensing elements comprise at least two magnetoresistance elements coupled in a bridge arrangement with two other circuit elements.

18. The electronic circuit of claim 16, wherein the one or more magnetic field sensing elements comprise one or more magnetoresistance elements.

19. The electronic circuit of claim 16, wherein the one or more magnetic field sensing elements comprise one or more Hall elements.

20. The electronic circuit of claim 16, Wherein the plurality of resistors has values of R and 2R and is arranged as first and second R-2R networks, the first R-2R network forming a first digital-to-analog converter (DAC) and the second R-2R network forming a second digital-to-analog converter (DAC), the first DAC having a node coupled to the first transistor and the second DAC having a node coupled to the second transistor.

21. The electronic circuit of claim 20, wherein the plurality of switches is arranged as pairs of switches, each pair of switches having a first switch coupled to the first DAC and a second switch coupled to the second DAC, wherein the first switch closes and the second switch opens in response to particular state of a control signal received at control nodes of the first and second switches, directing a current generated by one of the plurality of current generators to either the first DAC of to the second DAC accordingly.

22. The electronic circuit of claim 16, wherein the selection circuit comprises a programmable device configured to store a value indicative of selected ones of the plurality of switches that are closed.

23. The electronic circuit of claim 22, wherein the programmable device comprises an EEPROM.

24. The electronic circuit of claim 22, wherein the programmable device comprises a plurality of fusible links.

25. The electronic circuit of claim 16, wherein each one of the plurality of current generators comprises:
a reference voltage generating device configured to generate a reference voltage that is stable with respect to temperature;
a temperature proportional voltage generating device configured to generate a temperature proportional voltage that is proportional to temperature;
a first respective current generator coupled to receive the reference voltage and configured to generate a reference current; and
a second respective current generator coupled to receive the temperature proportional voltage and configured to generate a temperature proportional current that is proportional to temperature.

26. The electronic circuit of claim 25, wherein the plurality of switches comprises a first plurality of switches and a second plurality of switches coupled together in a plurality of pairs of switches, each pair of switches comprised of a respective one of the first plurality of switches coupled to a respective one of the second plurality of switches, and wherein the first plurality of switches is coupled to receive the reference current from a respective one of the plurality of current generators, and wherein the second plurality of switches is coupled to receive the temperature proportional current from a respective one of the plurality of current generators.

* * * * *

UNITED STATES PATENT AND TRADEMARK OFFICE
CERTIFICATE OF CORRECTION

PATENT NO. : 8,736,369 B2
APPLICATION NO. : 13/533404
DATED : May 27, 2014
INVENTOR(S) : Craig S. Petrie It is certified that error appears in the above-identified patent and that said Letters Patent is hereby corrected as shown below:

Specification

Column 1, line 38 delete "and/or of a" and replace with --and/or a--.

Column 1, line 66 delete "experience" and replace with --experiences--.

Column 2, lines 23-24 delete "performance a" and replace with --and performance of a--.

Column 3, line 24 delete "$R_1$," and replace with --$R_1$.--.

Column 5, line 39 delete "though" and replace with --through--.

Column 6, line 31 delete "range = $\pm 21R(1-2^{-N})$" and replace with --range = $\pm 21R - (1 - 2^{-N})$--.

Column 7, line 2 delete "can be…" and replace with --can be programmed during manufacture of the electronic circuit 100. However, it is also possible to program the memory device within the selection circuit 116 at any time.--.

Column 7, lines 3-6 delete "The set of… circuit 116." and replace with --delete this paragraph it is duplicative--.

Column 7, line 24 delete "circuit 118." and replace with --circuit 116.--.

Column 7, line 45-46 delete "be switched…" and replace with --be switched current type DAC.--.

Column 8, line 13 delete "switches 163" and replace with --switches 168--.

Claims

Signed and Sealed this
Fifteenth Day of December, 2015

Michelle K. Lee
*Director of the United States Patent and Trademark Office*

CERTIFICATE OF CORRECTION (continued)
U.S. Pat. No. 8,736,369 B2

Column 12, line 21 Claim 3 delete "of to" and replace with --or to--.

Column 13, line 10 Claim 16 delete ",Wherein..." and replace with --, wherein...--.

Column 14, line 2 Claim 21 delete "of to" and replace with --or to--.